United States Patent
Wajima et al.

(10) Patent No.: US 6,865,090 B2
(45) Date of Patent: Mar. 8, 2005

(54) OUTER COATING SUBSTRATE FOR ELECTRONIC COMPONENT AND PIEZOELECTRIC RESONANT COMPONENT

(75) Inventors: Masaya Wajima, Shinminato (JP); Tsuneo Amano, Toyama (JP); Kenichi Kotani, Toyama-ken (JP); Kenichi Sakai, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 326 days.

(21) Appl. No.: 10/127,472

(22) Filed: Apr. 23, 2002

(65) Prior Publication Data

US 2002/0135274 A1 Sep. 26, 2002

Related U.S. Application Data

(62) Division of application No. 09/740,914, filed on Dec. 20, 2000, now Pat. No. 6,448,696.

(30) Foreign Application Priority Data

Dec. 20, 1999 (JP) ............................................ 11-361549
Dec. 24, 1999 (JP) ......................................... 11-367569

(51) Int. Cl.⁷ ................................................ H05K 1/03
(52) U.S. Cl. ...................... 361/793; 361/795; 174/258; 428/210
(58) Field of Search .......................... 428/210; 361/792, 361/793, 795; 174/250, 255, 256, 258; 257/703

(56) References Cited

U.S. PATENT DOCUMENTS 5,102,720 A    4/1992  Raj
5,387,474 A  * 2/1995  Mikeska et al. ............ 428/688
5,708,570 A  * 1/1998  Polinski, Sr. ................ 361/762
5,769,987 A    6/1998  Gurkovich et al.

FOREIGN PATENT DOCUMENTS

| CN | 1237830 A | 12/1999 | |
|----|-----------|---------|---|
| JP | 3-079111  | 4/1991  | |
| JP | 4-004604 A | 1/1992 | |
| JP | 4-23324   | 2/1992  | |
| JP | 4-077011 A | 3/1992 | |
| JP | 6-260872  | 9/1994  | |
| JP | 6-310862  | 11/1994 | |
| JP | 8-18392 A  * | 1/1996 | H03H/9/58 |
| JP | 08-018392 A * | 1/1996 | |
| JP | 8-018392  | 1/1996  | |
| JP | 8-125482  | 5/1996  | |
| JP | 9-208261  | 8/1997  | |
| JP | 10-106880 | 4/1998  | |
| JP | 10-308584 | 11/1998 | |
| JP | 11-103169 | 4/1999  | |
| JP | 11-103169 A * | 4/1999 | H05K/3/46 |

* cited by examiner

Primary Examiner—John B. Vigushin
(74) Attorney, Agent, or Firm—Keating & Bennett, LLP

(57) ABSTRACT

An outer coating substrate for an electronic component is constructed to be calcined at a low temperature, and greatly decreases the cost thereof while greatly improving the dimensional precision of the substrate. The outer coating substrate for an electronic component includes a multi-layered substrate including a first material layer that is sintered in a liquid phase and a second material layer that is not sintered at the sintering temperature of the first material layer. The first and second material layers are laminated, and calcined at the calcining temperature of the first material layer.

6 Claims, 14 Drawing Sheets

OUTER COATING SUBSTRATE FOR ELECTRONIC COMPONENT AND PIEZOELECTRIC RESONANT COMPONENT

This application is a Divisional of U.S. patent application Ser. No. 09/740,914 filed Dec. 20, 2000, now U.S. Pat. No. 6,448,696.

BACKGROUND OF THE INVENTION

1. Field of the Invention

The present invention relates to outer coating substrates for electronic components, for example, piezoelectric oscillators, and piezoelectric resonant components including the outer coating substrates. In particular, the present invention relates to outer coating substrates for electronic components which are constituted by laminating various material layers, and piezoelectric resonant components using the outer coating substrates.

2. Description of the Related Art

In electronic components, for example, piezoelectric oscillators, outer coating substrates made of ceramics have been widely used to protect electronic component elements.

For example, a piezoelectric resonator 101 shown in FIG. 10 is disclosed in Japanese Unexamined Patent Application Publication No. 4-4604. In the piezoelectric resonator 101, outer coating substrates 103 and 104 are laminated on the top and bottom of an energy trap piezoelectric resonant element 102. The outer coating substrates 103 and 104 are made of alumina obtained by low temperature calcining. Ceramics, for example, alumina, is superior in strength. However, manufacturing costs are high due to high calcining temperatures. It is disclosed in Japanese Unexamined Patent Application Publication No. 4-4604 that the calcining temperatures are lowered to reduce the manufacturing costs.

On the other hand, a crystal oscillator shown in FIG. 11 is disclosed in Japanese Unexamined Patent Application Publication No. 9-208261. In this disclosure, the crystal oscillator 112 is sealed in a package composed of a base member 113 and a cap member 114. The base member 113 and the cap member 114 are made of a glass-ceramics composite so that calcining at a low temperature of about 800° C. to 1000° C. is described as being possible.

Furthermore, a composite layer ceramic component shown in FIG. 12 is disclosed in Japanese Unexamined Patent Application Publication No. 10-106880. In this disclosure, low dielectric constant layers 121 and 124 are arranged as outermost layers, and the low dielectric constant layers 121 and 124 are made of a mixed material of ceramic powder and amorphous glass. High dielectric constant layers 122 and 123 are arranged between the low dielectric constant layers 121 and 124. It is described that characteristics of capacitors, resonators, and other electronic components, which include conductor layers 125 and 126, are improved by the high dielectric constant layers 122 and 123.

The outer coating substrates 103 and 104 of the piezoelectric resonator described in Japanese Unexamined Patent Application Publication No. 4-4604 can be calcined at a relatively low temperature. However, the contraction rate during calcination is large. Therefore, it has been a problem that the dimensional precision of the outer coating substrates 103 and 104 is insufficient.

On the other hand, a glass-ceramics composite is used in the structure described in Japanese Unexamined Patent Application Publication No. 9-208261 and in Japanese Unexamined Patent Application Publication No. 10-106880. The glass-ceramics composite can be calcined at a low temperature. However, the contraction rate during calcination is large also, and the precision of substrate dimension has been insufficient.

SUMMARY OF THE INVENTION

In order to overcome the problems described above, preferred embodiments of the present invention provide an outer coating substrate for an electronic component that is arranged to be calcined at a low temperature, and to achieve greatly improved dimensional precision. In addition, preferred embodiments of the present invention provide a piezoelectric resonant component having an outer coating substrate that is arranged to be calcined at a low temperature and is superior in dimensional precision, while also being low cost.

According to a first preferred embodiment of the present invention, an outer coating substrate for an electronic component includes a multi-layered substrate having a first material layer and a second material layer laminated together, wherein the first material layer is sintered in a liquid phase and the second material layer is not sintered at the sintering temperature of the first material layer.

In one preferred embodiment of the present invention, the first material layer is preferably made of glass or glass-ceramics.

It is also preferable that the first material layer does not contain a component that dissolves into a wet plating bath.

Also, a concave portion is preferably formed on at least one major surface of the substrate.

The outer coating substrate preferably has at least one pair of capacitive electrodes, arranged to interpose at least a portion of the second material layer, and a capacitor is defined by the pair of capacitive electrodes.

In other preferred embodiment of the present invention, a resistive element and an inductance element are preferably provided in the outer coating substrate and are made of a resistive material and a magnetic material.

In another preferred embodiment of the present invention, at least two layers of the first material layer are laminated with the second material layer in the substrate.

According to another preferred embodiment of the present invention, a piezoelectric resonant component includes a piezoelectric resonant element and first and second outer coating substrates laminated on the top and bottom of the piezoelectric resonant element, wherein at least one of the first and second outer coating substrates includes a multi-layered substrate having a laminate structure having a first material layer that is sintered in a liquid phase and a second material layer that is not sintered at the sintering temperature of the first material layer.

In one specific example of the preferred embodiment described in the preceding paragraph, the piezoelectric resonant element is an energy trap piezoelectric resonant element, and the first and second outer coating substrates are laminated on the piezoelectric resonant element so as to define a space that allows for free and unhindered vibration of resonant portion of the energy trap piezoelectric resonant element.

In another preferred embodiment of the present invention, a concave portion is preferably provided on a surface of at least one of the first and second outer coating substrates, so as to define a space that allows for free and unhindered vibration of resonant portion of the energy trap piezoelectric resonant element.

It is preferred that the first material layer is made of glass or glass-ceramics in this preferred embodiment of the present invention.

It is also preferred that the first and second outer coating substrates do not contain a component that dissolves into a wet plating bath.

In at least one of the first and second outer coating substrates, at least one pair of capacitive electrodes is arranged to interpose at least a portion of the first material layer, and a capacitor is defined by the pair of capacitive electrodes.

Also, in at least one of the first and second outer coating substrates, a resistive element and an inductance element are preferably provided and include a resistive material and a magnetic material, respectively.

In addition, at least one of the first and second outer coating substrates preferably has a plurality of the first material layers.

According to various preferred embodiments of the present invention, a piezoelectric resonant component includes a package substrate, a piezoelectric resonant element fixed on the package substrate, and a junction member fixing the piezoelectric resonant element to the package substrate, wherein the Young's modulus of the package substrate is less than a Young's modulus of a piezoelectric material constituting the piezoelectric resonant element.

In such a preferred embodiment of the present invention, the package substrate is preferably a multi-layered package substrate having at least two layers.

The multi-layered package substrate preferably includes a first layer having a Young's modulus that is greater than the Young's modulus of the piezoelectric material, and a second layer having a Young's modulus that is less than the Young's modulus of the piezoelectric material.

The second layer having the smaller Young's modulus is preferably made of a composite material of amorphous glass and ceramic powder, and the second layer having the greater Young's modulus is preferably made of $Al_2O_3$ or $MgTiO_3$.

The piezoelectric resonant element is preferably an energy trap piezoelectric resonant element having a piezoelectric plate, and a resonant portion partially provided on the piezoelectric plate.

Piezoelectric resonant components according to various preferred embodiments of the present invention are possible to be formed as components having various structures according to the aforementioned piezoelectric resonant element, the package substrate, and the junction member.

In a preferred embodiment of the present invention, package substrates are preferably laminated on both sides of the piezoelectric resonant element so as to allow for free and unhindered vibration of the piezoelectric resonant element.

Furthermore, a cap is preferably joined to the package substrate in order to surround the piezoelectric resonant element fixed on the package substrate.

The package substrate preferably has a concave portion to accommodate the piezoelectric resonant element, and, furthermore, a cover member is preferably fixed to the package substrate to close the concave portion.

Other features, characteristics, elements and advantages of the present invention will become more apparent from the detailed description of preferred embodiments thereof with reference to the attached drawings.

DETAILED DESCRIPTION OF PREFERRED EMBODIMENTS

Figure 2:
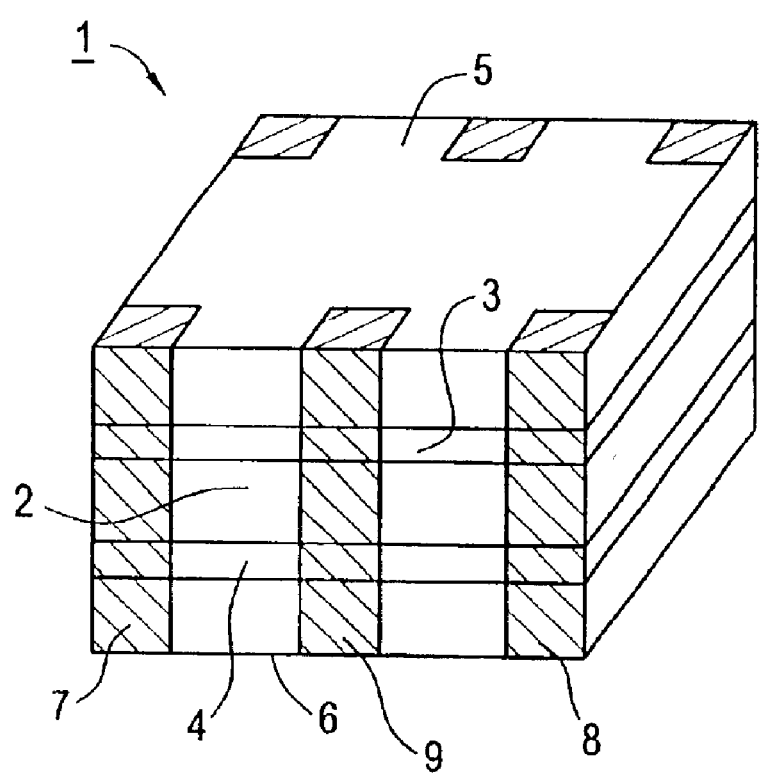
FIG. 2 is a perspective view of a piezoelectric resonant component according to a preferred embodiment of the present invention.

FIG. 2 is a perspective view of a piezoelectric resonant component according to the first preferred embodiment of the present invention. A piezoelectric resonant component 1 preferably includes first and second outer coating substrates 5 and 6 disposed on the top and bottom of a piezoelectric resonant element 2 interposing adhesive layers 3 and 4.

External electrodes 7 to 9 are provided on the outer surface of the piezoelectric resonant component 1. In the piezoelectric resonant component 1, the outer electrodes 7 to 9 are arranged, respectively, to extend over a pair of side surfaces, a bottom surface, and a component of the top surface of the outer surface of a laminate wherein the aforementioned piezoelectric resonant element 2, adhesive layers 3 and 4, and outer coating substrates 5 and 6 are laminated. In other words, the outer electrodes 7 to 9 are arranged to wind around the periphery of the aforementioned laminate except for being cut off on the top surface of the laminate as shown in FIG. 2. A component of the outer electrode extending on the top surface of the laminate may be omitted.

This preferred embodiment includes a unique arrangement of the outer coating substrates 5 and 6. The aforementioned piezoelectric resonant component is explained in detail with reference to FIGS. 1A and 1B.

Figure 1A:
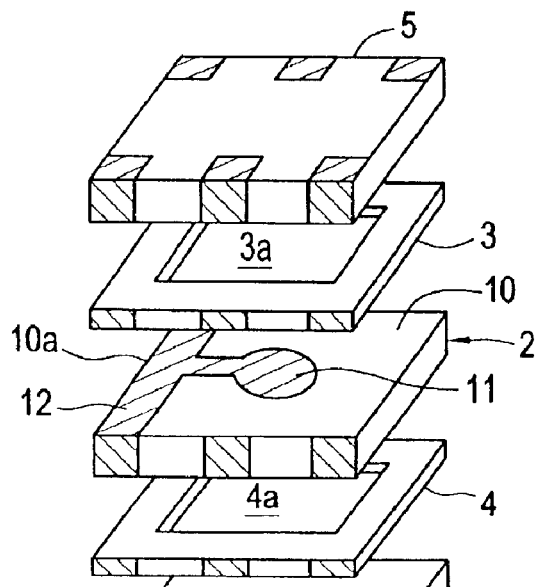
FIGS. 1A and 1B are a perspective assembly view of a piezoelectric resonant component and a perspective assembly view of one outer coating substrate according to the first preferred embodiment of the present invention.
Figure 1B:
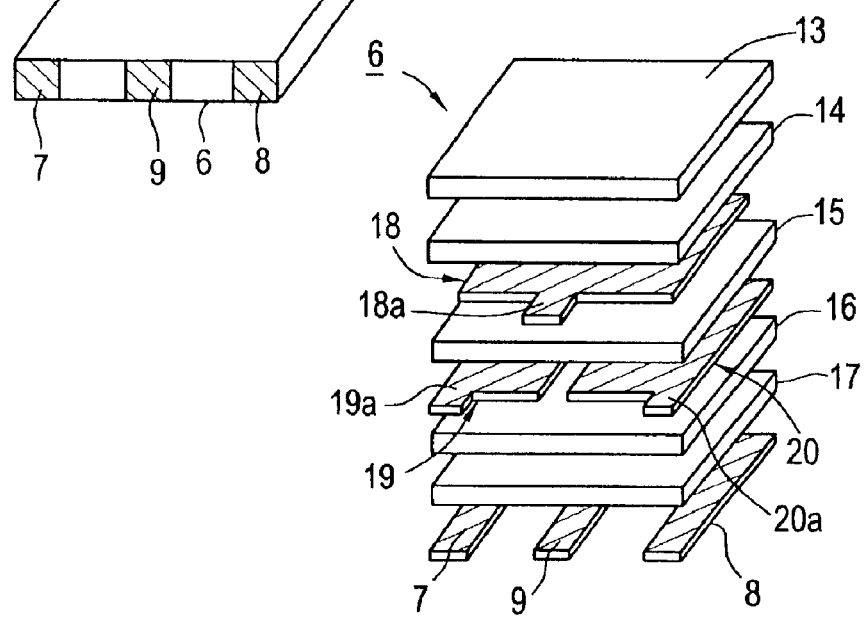

FIG. 1A is a perspective assembly view of a piezoelectric resonant component 1, and FIG. 1B is a perspective assembly view of a lower outer coating substrate 4.

As shown in FIG. 1A, the piezoelectric resonant element 2 preferably includes a piezoelectric plate 10 having a substantially rectangular shape. The piezoelectric plate 10 is preferably made of a piezoelectric ceramic material, for example, a lead zirconate titanate ceramics, or a piezoelectric single crystal, for example, crystal.

An excitation electrode 11 is disposed at the approximate center of the top surface of the piezoelectric plate 10. An excitation electrode, not shown in FIG. 1, is also provided at the approximate center of bottom surface of the piezoelectric plate 10, and the excitation electrode of the bottom surface and the excitation electrode 11 are arranged to face each other on the top and bottom surfaces interposing the piezoelectric plate 10.

On the top surface of the piezoelectric plate 10, the excitation electrode 11 is connected to a leading electrode 12 arranged along an end edge 10a. The leading electrode 12 is arranged to reach both side edges of the piezoelectric plate 10. Hereafter, the side edge means the outer edge extending in a direction that is perpendicular to the end edge 10a and corresponds ultimately to an exposed component on the side surface of the laminate. That is, in the piezoelectric resonant component 1, the leading electrode 12 is exposed on a pair of side surfaces of the aforementioned laminate.

Then, the leading electrode 12 is electrically connected to the outer electrode 7 on the side surface of the laminate.

Similarly, the excitation electrode disposed on the bottom surface is also connected to a leading electrode, and the leading electrode, arranged to reach both side edges on the bottom surface of the piezoelectric plate 10, is electrically connected to the outer electrode 8.

The aforementioned piezoelectric resonant element 2 is preferably an energy trap piezoelectric resonant element, and a resonant portion preferably includes the component having the excitation electrode 11 arranged to face the excitation electrode on the bottom surface. The adhesive layers 3 and 4 have openings 3a and 3b, respectively, to define a space that allows for free and unhindered vibration of the resonant portion. That is, the adhesive layers 3 and 4 have a plan shaped, substantially rectangular frame.

As shown in FIG. 1B, the outer coating substrate 6 has a structure including a plurality of material layers 13 to 17 are laminated interposing inner electrodes 18 to 20. The material layers 14 and 16 are the first material layers which are preferably made of a material that is sintered in a liquid phase, and the material layers 13, 15, and 17 are the second material layers that are not sintered at the sintering temperature of the first material layers 14 and 16.

That is, in this preferred embodiment, the first material layers 14 and 16 and the second material layers 13, 15, and 17 are alternately laminated. Then, outermost layers are preferably defined by the second material layers 13 and 17.

As materials constituting the first material layers 14 and 16 that are sintered in the liquid phase, for example, glass or glass-ceramics composite material, is preferably used. More specifically, it is possible to constitute the first material layers 14 using a crystalline glass, for example, an anorthite crystalline glass, a forsterite crystalline glass, cordierite crystalline glass, a celsian crystalline glass, or various amorphous glass, for example, $SiO_2$—$MgO$—$Al_2O_3$ series, $SiO_2$—$Al_2O_3$ series, $SiO_2$—$Al_2O_3$—$CaO$ series, $SiO_2$—$Al_2O_3$—$BaO$ series, $SiO_2$—$CaO$ series.

The second material layers 13, 15, and 17 are preferably composed of a material that is not sintered at the sintering temperature of the first material layers 14 and 16 that are sintered in the liquid phase. As such a material, an inorganic solid powder having a high melting point may be used, and more specifically, $Al_2O_3$, $BaTiO_3$, $ZrO_2$, mullite, and other suitable materials, and mixtures thereof may be used. However, the material constituting the second material layers 13, 15, and 17 is not limited to a ceramic material as mentioned above, but a glass material is usable as long as the glass material has a sufficiently higher softening point than the material constituting the first material layers 14 and 16, and such material is not sintered during the sintering of the first material layers.

The first inner electrode 18 and the second and third inner electrodes 19 and 20 are arranged to define a three-terminal capacitor in the outer coating substrate 6. The first inner electrode 18 and the second and third inner electrodes 19 and 20 are stacked interposing the second material layer 15. The second inner electrode 19 has a leading portion 19a exposed on the side surface of the laminate, and the leading portion 19a is electrically connected to the first outer electrode 7. Similarly, the third inner electrode 20 has a leading portion 20a exposed on the side surface of the laminate, and the leading portion 20a is electrically connected to the second outer electrode 8.

Furthermore, the first inner electrode 18 has a leading portion 18a that extends out to the approximate center of side surface of the aforementioned laminate. The leading portion 18a is electrically connected to the third outer electrode 9.

Therefore, the three-terminal capacitor is connected between the first to third outer electrodes 7 to 9. In particular, the first and second outer electrodes 7 and 8 are electrically connected, respectively, to the excitation electrode 11, the bottom surface, and the excitation electrode on the bottom surface of the piezoelectric resonant element 2. Therefore, by connecting the first and second outer electrodes 7 and 8 to input/output electrodes and connecting the third outer electrode 9 to ground, a three-terminal built in load capacitance type piezoelectric oscillator is provided.

It is not shown in the drawing, but the upper outer coating substrate 5 is arranged similar to the lower outer coating substrate 6, and in the outer coating substrate 5, a three-terminal capacitor is similarly provided.

In the piezoelectric resonant component 1 of this preferred embodiment, the outer coating substrate 6 has a structure wherein the first material layers 14 and 16 and the second material layers 13, 15, and 17 are laminated, as mentioned above. In this case, the calcining temperature, which changes due to the composition, of the first material layers 14 and 16, sintering in the liquid phase, is about 800° C. to about 1000° C. when it is composed of the aforementioned material. That is, the first material layers 14 and 16 are calcined at a relatively low temperature. In this case, the material constituting the second material layers 13, 15, and 17 is not sintered at the calcining temperature of the first material layers 14 and 16 that are sintered in the liquid phase.

Therefore, the material constituting the second material layers 13, 15, and 17 is penetrated into a liquid phase sintering material layer, and thereafter, the first material layers 14 and 16 that are sintered in the liquid phase are calcined so that the first material layers 14 and 16 and the second material layers 13, 15, and 17 are combined and united firmly. In particular, the contraction of the first material layers 14 and 16 during calcination are restricted by the second material layers 13, 15, and 17. Then, the contraction in a direction parallel to the primary surfaces of the first material layers 14 and 16 is prevented by the restriction effect of the material layers 13, 15, and 17 so that it is possible to obtain an outer coating substrate 6 having high dimensional precision.

Similarly, in the upper outer coating substrate 5, because it is arranged similarly to the outer coating substrate 6, the contraction of the first material layers during calcination are restricted by the second material layers functioning as the restriction material layer, then, the outer coating substrate 5 having very high dimensional precision can be also obtained.

Therefore, according to this preferred embodiment, because the dimensional precision of the outer coating substrates 5 and 6 is greatly improved, and the calcining temperatures are relatively low as mentioned above, the costs of the outer coating substrates 5 and 6 are greatly reduced. In the piezoelectric resonant component 1, because the outer coating substrates 5 and 6 having high dimensional precision, as mentioned above, are used, the precision of outer dimension of the piezoelectric resonant component 1 itself is also effectively improved.

Furthermore, because the dimensional precision of the outer coating substrates 5 and 6 is greatly improved, the precision of electrostatic capacity of the three-terminal capacitor provided in the outer coating substrates 5 and 6, as an electronic component functional element, is also significantly improved.

In this preferred embodiment, the second material layer 15 is arranged between the first inner electrode 18 and the second and third inner electrodes 19 and 20, and, the electrostatic capacity is derived with the second material layer 15. However, the first material layer may be arranged between the first inner electrode 18 and the second and third inner electrodes 19 and 20 to define an electrostatic capacity.

Figure 3A:
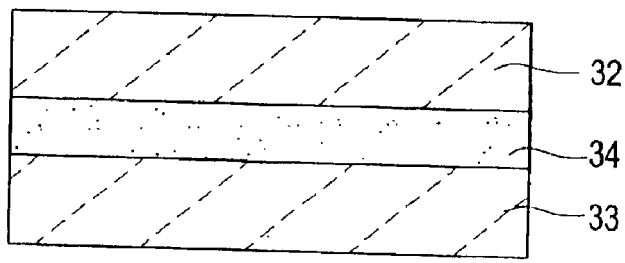
FIGS. 3A to 3D are sectional views of modified examples representing various arrangements of the first and second material layers in an outer coating substrate according to various preferred embodiments of the present invention.
Figure 3B:
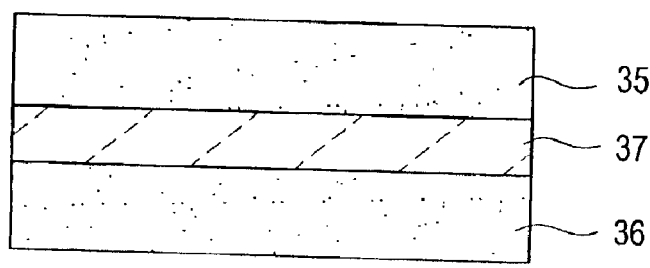
Figure 3C:
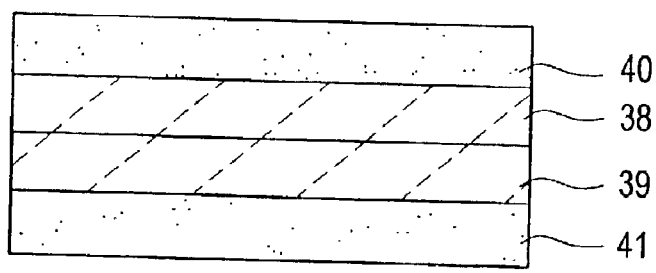

In various preferred embodiments of the present invention, at least one layer of the first material layer and the second material layer may be arranged, and the number of each layer, thickness, and arrangement may be appropriately changed. For example, as an outer coating substrate 31 shown in FIG. 3A, the second material layer 34 may be arranged between the first material layers 32 and 33. As shown in FIG. 3B, reversely, the first material layer 37 may be arranged between the second material layers 35 and 36. As shown in FIG. 3C, the second material layers 40 and 41 may be laminated on the top and bottom of two layers defined by the first material layers 38 and 39.

Figure 3D:
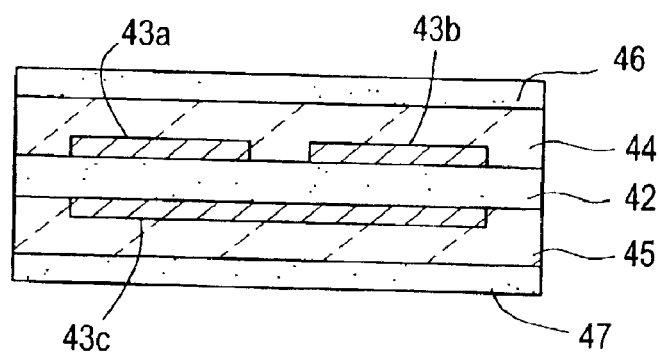

As shown in FIG. 3D, inner electrodes 43a to 43c may be disposed on the top and bottom of the second material layer 42 to constitute a capacitor, the first material layers 44 and 45 may be laminated on the top and bottom layers thereof, and the second material layers 46 and 47 may be laminated on the outermost layers.

In the case in which the inner electrode is located in the outer coating substrate as mentioned above, the inner electrode may be formed by printing the conductive paste, and thereafter, may be calcined at the same time with the outer coating substrate. The outer electrodes 7 to 9 may be formed, after preparing the aforementioned laminate constituting the piezoelectric resonant component 1, by separately coating the conductive paste and baking, or by the thin film forming method, for example, vapor deposition.

The aforementioned laminate may be prepared at the stage before calcining the outer coating substrates 5 and 6, and the laminate may be coated with the conductive paste, then, the outer electrodes 7 to 9 may be completed by calcining at the same time with the calcining of the outer coating substrates 5 and 6.

In the first preferred embodiment, the outer electrodes 7 to 9 are preferably formed by various methods as mentioned above. Furthermore, a plated film may be formed by the wet plating method on the surface of the outer electrodes in order to improve solderability and other characteristics. In such a case, it is preferable that the outer coating substrates 5 and 6 are constituted using materials not containing a component, for example, Zr, that dissolves into a plating bath used in the wet plating. That is, as the first and second material layers, the aforementioned materials not containing a component that dissolves into a plating bath are preferably used so that the outer coating substrates 5 and 6, having superior plating resistance, can be formed.

In this preferred embodiment, the outer coating substrates 5 and 6 have the structure laminating the first and second material layers. However, one of the outer coating substrates may be an outer coating substrate which is not an outer coating substrate constructed according to preferred embodiments of the present invention, for example, a substrate made of a single material selected from ceramics, glass-ceramics, glass, or other suitable material. That is, as far as at least one outer coating substrate is constituted according to various preferred embodiments of the present invention, the dimensional precision of the outer coating substrate, constituted according to preferred embodiments of the present invention, is still greatly improved. Therefore, the dimensional precision of the piezoelectric resonant component 1 is also significantly improved.

Figure 4A:
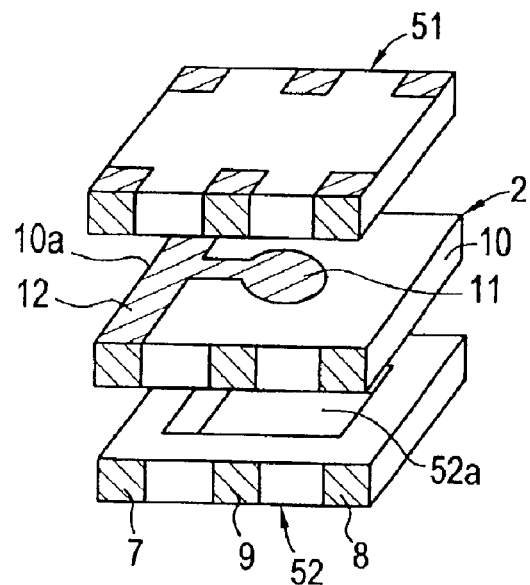
FIGS. 4A and 4B are a perspective assembly view of a piezoelectric resonant component and a perspective assembly view of one outer coating substrate according to the second preferred embodiment of the present invention.
Figure 4B:
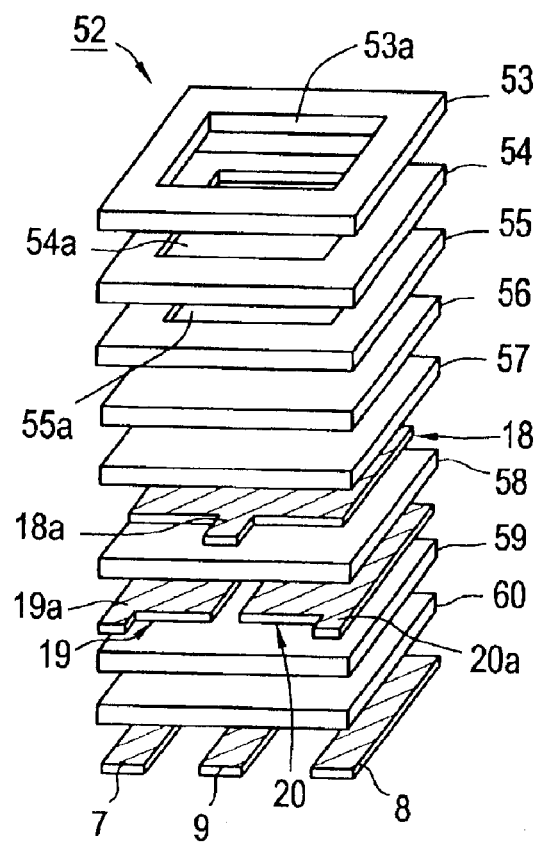

FIGS. 4A and 4B are perspective assembly views for explanation of the piezoelectric resonant component according to the second preferred embodiment of the present invention. In this preferred embodiment, outer coating substrates 51 and 52 are laminated on the top and bottom of the piezoelectric resonant element 2. A concave portion 52a is provided on the top surface of the outer coating substrates 52. A concave portion, not shown in the drawing, is similarly formed on the bottom surface of the outer coating substrates 51. The concave portion 52a is arranged to define a space that allows for free and unhindered vibration of the energy trap resonant portion of the piezoelectric resonant element.

FIG. 4B is a perspective assembly view of the outer coating substrate 52. In the outer coating substrate 52, similar to the outer coating substrate 6 according to the first preferred embodiment, the first to third inner electrodes 18 to 20 are arranged inside.

The outer coating substrate 52 has a structure wherein the aforementioned inner electrodes 18 to 20 and material layers 53 to 60 are laminated together. Among these, the material layers 53, 55, 56, 58, and 60 are the second material layers, and the material layers 54, 57, and 59 are the first material layers.

The material layers 53 to 55, constituted to have, respectively, a plan shaped, substantially rectangular frame, have substantially rectangular openings 53a to 55a. The openings 53a to 55a are arranged to define the aforementioned concave portion 52a.

Regarding other points, because of the similarity to the first preferred embodiment, explanations about the same elements are omitted and similar reference numerals are used to represent similar elements. In this preferred embodiment, also, the upper outer coating substrate 51 is arranged similarly to the lower outer coating substrate 52. However, the upper outer coating substrate 51 may be composed of an outer coating substrate that is not the outer coating substrate constructed according to preferred embodiments of the present invention.

In the second preferred embodiment, because, similarly to the first preferred embodiment, the outer coating substrate 52 has a structure wherein the first material layers 54, 57, and 59 and the second material layers 53, 55, 56, 58, and 60 are laminated, the dimensional precision is greatly improved, and the precision of electrostatic capacity of the three-terminal capacitor is also significantly improved. Furthermore, the outer coating substrate 52 can be calcined at a low temperature.

Therefore, similarly to the first preferred embodiment, in the piezoelectric resonant component 51, it is possible to improve the dimensional precision, to reduce the cost, and to reduce the dispersion of electrostatic capacity.

Figure 5:
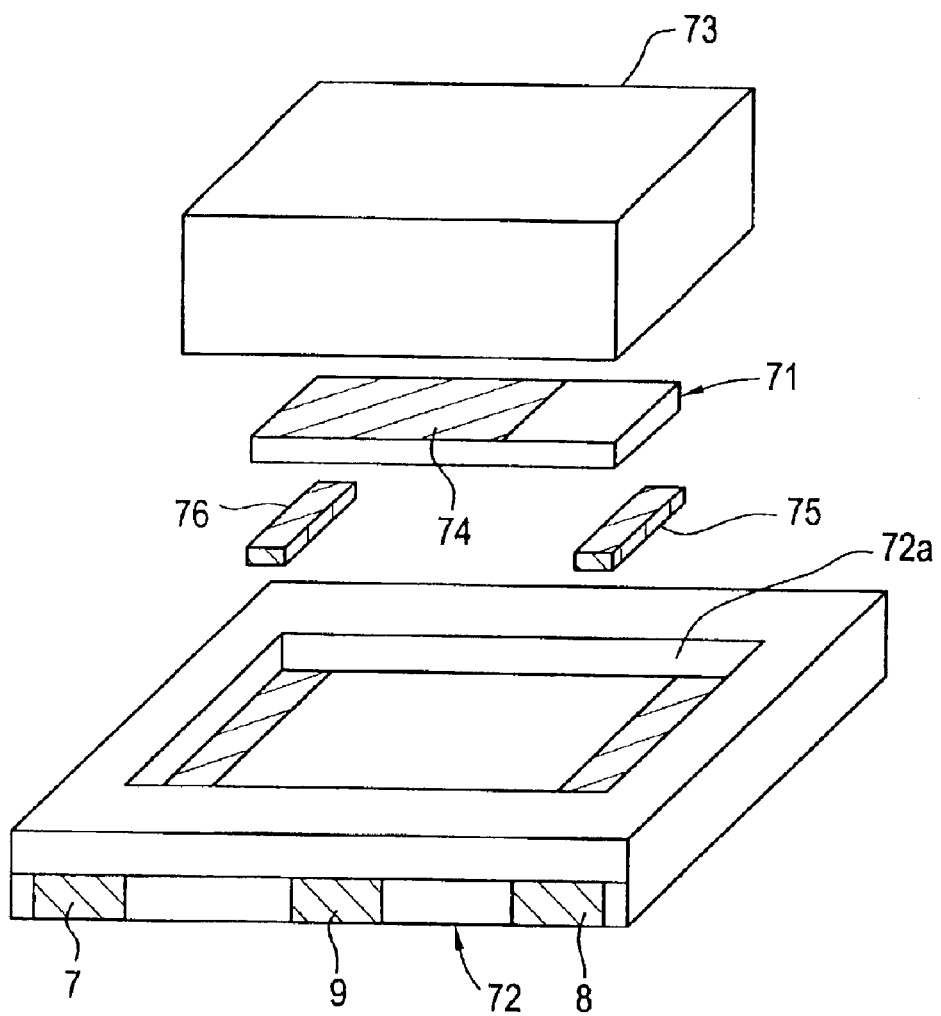
FIG. 5 is a perspective assembly view of a piezoelectric resonant component according to the third preferred embodiment of the present invention.
Figure 6:
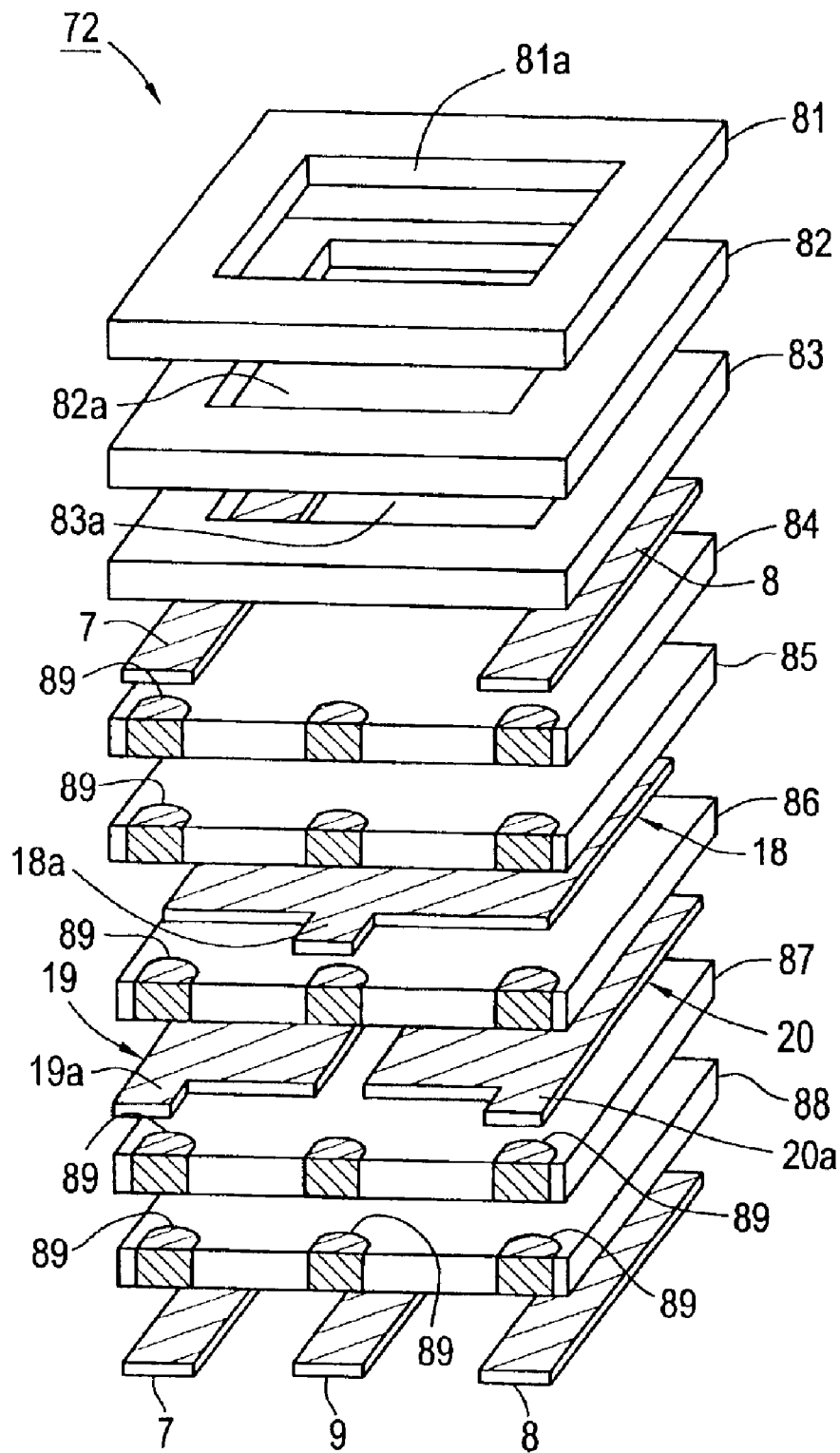
FIG. 6 is a perspective assembly view of an outer coating substrate used in the piezoelectric resonant component according to the third preferred embodiment of the present invention.

FIG. 5 and FIG. 6 are a perspective assembly view for explanation of a piezoelectric resonant component according to the third preferred embodiment of the present invention and a perspective assembly view for explanation of an outer coating substrate.

In the piezoelectric resonant component according to this preferred embodiment, an energy trap piezoelectric resonant element 71 using the thickness slip mode is stored in a package including outer coating substrates 72 and 73. The outer coating substrate 72 has a storage concave 72a. The storage concave 72a is opened in the top surface of the outer coating substrate 72, and is constituted to have a size where the piezoelectric resonant element 71 can be stored. The first and second outer electrodes 7 and 8 are arranged to extend from the bottom surface of the storage concave 72a to the side surface of the outer coating substrate 72. The third outer electrode 9 is located in the approximate center of the side surface of the outer coating substrate 72. The first to third outer electrodes 7 to 9 are not only exposed on the side surface of the outer coating substrate 72 but also arranged to extend from the side surface to the opposite side surface via the bottom surface.

On the other hand, the first excitation electrode 74 is formed on the top surface of the piezoelectric resonant element 71. An excitation electrode is also formed on the bottom surface in order to face the excitation electrode 74 in the approximate center of the piezoelectric resonant element 71, wherein these electrodes are correspondingly positioned on the top and bottom surfaces. The excitation electrode on the bottom surface is extended to the right in FIG. 5, and is electrically connected to the outer electrode 8 exposed in the storage concave 72a via a conductive junction member 75. The excitation electrode 74 is disposed on the top surface of the piezoelectric resonant element 71, and, at one end of the piezoelectric resonant element 71, is extended from the end surface to the bottom surface. The extended component of the excitation electrode 74 on the bottom surface is electrically connected to the outer electrode 7 exposed in the storage concave 72a via a conductive junction member 76. The piezoelectric resonant element 71 is stored in the storage concave interposing the conductive junction members 75 and 76, and is fixed.

On the other hand, the resonant portion of the piezoelectric resonant element 71 is positioned at the approximate center in longitudinal direction, and, in this preferred embodiment, due to the thickness of the aforementioned conductive junction members 75 and 76, a space for allowing for free and unhindered vibration is constituted below the resonant portion.

The outer coating substrate 73, in the shape of a cap, has an opening (not shown in the drawing) has opening facing downward, and the opening periphery is joined to the outer coating substrate 72 by an insulating adhesive (not shown in the drawing).

This preferred embodiment is characterized in that the outer coating substrate 72 is constituted according to preferred embodiments of the present invention.

Materials for the cap are not particularly limited, and ceramics, for example, alumina, resins, metals, and other suitable materials, are usable. Metals are suitable for achieving miniaturization and ease of shaping. Metallic materials are not particularly limited, and 42Ni alloys, aluminum alloys, nickel silver, and other suitable metals, are usable.

As shown in FIG. 6, the outer coating substrate 72 is constituted by laminating material layers 81 to 88, wherein inner electrodes 18 to 20 and outer electrodes 7 and 8 are interposed. Among the material layers 81 to 88, material layers 82, 85, and 87 are the first material layers, and material layers 81, 83, 84, 86, and 88 are the second material layers. In the material layers 81 to 83, substantially rectangular openings 81a to 83a are formed, respectively, to define the aforementioned concave 72a.

Parts of the outer electrodes 7 and 8, interposed between the material layers 83 and 84, are formed by the coating and baking of the conductive paste. The baking of the conductive paste is conducted, similarly to the inner electrodes 18 to 20, when the outer coating substrate 72 is calcined.

The inner electrodes 18 to 20 are constituted similarly to the inner electrodes 18 to 20 according to the first preferred embodiment.

Notches 89 are preferably formed in both side surfaces of the material layers 84 to 88, and the notches 89 are filled with the conductive paste. The paste is baked to constitute parts of the outer electrodes 7 to 9 which are exposed on the side surface of the outer coating substrate 72.

The parts of the outer electrodes 7 to 9, located on the side surface of the outer coating substrate 72, may be formed, after calcining the outer coating substrate 72, by an arbitrary method, for example, by the coating and baking of the conductive paste, or by the thin film forming method, for example, vapor deposition, plating, or sputtering.

However, as in this preferred embodiment, because the outer electrodes 7 to 9 are formed at the same time with the calcination of the outer coating substrate 72, by filling the notches with the conductive paste and forming parts of the outer electrodes 7 to 9 on the side surface, parts to be exposed in the storage concave 72a, and parts to be positioned on the bottom surface of the material layer 88, during the calcining of the outer coating substrate 72, i.e., by the simultaneous calcining method, simplification of the manufacturing process is achieved.

In the third preferred embodiment, because the outer coating substrate 72 is constituted according to preferred embodiments of the present invention, the dimensional precision of the outer coating substrate 72 is greatly improved, and the cost of the outer coating substrate 72 is significantly reduced. Therefore, the dimensional precision of the piezoelectric resonant component is also greatly improved. Furthermore, the dispersion of electrostatic capacity of the three-terminal capacitor included in the outer coating substrate 72 is also greatly reduced.

In the first to third preferred embodiments, the outer coating substrates and the piezoelectric resonant components according to the present invention are explained with reference to the perspective assembly view of only one piezoelectric resonant component. However, the outer coating substrates and the piezoelectric resonant components according to preferred embodiments of the present invention may be manufactured in the state of a mother substrate, thereafter, cut, finally or before calcining, into individual outer coating substrates or piezoelectric resonant component units. In the case in which conventional outer coating substrates are used, due to the contraction during the calcination, the dimensional precision of the aforementioned concave 72 is dispersed so that the numbers of outer coating substrates possible to be cut out of one mother substrate was restricted. Furthermore, an extra margin area, corresponding to generated dispersion in the dimension of the concave portion of each piezoelectric resonant component and storage concave, and dispersion in the dimension of outer coating substrates, had to be formed in the mother substrate. Therefore there was a problem that the dimension of finally obtained piezoelectric resonant component was become large.

On the other hand, in the case in which the outer coating substrates according to preferred embodiments of the present invention is used, as mentioned above, because the dimensional precision is greatly improved, the dimensional precision of the concave portion or the storage concave is significantly improved, the numbers of individual outer coating substrates or piezoelectric resonant components cut out of one mother substrate can be increased, and the miniaturization of outer coating substrate and piezoelectric resonant component can also be achieved.

In the outer coating substrate according to preferred embodiments of the present invention, by changing the thickness of the first and second material layers and the arrangement of the inner electrodes, outer coating substrates having various properties and characteristics can be provided.

Figure 7:
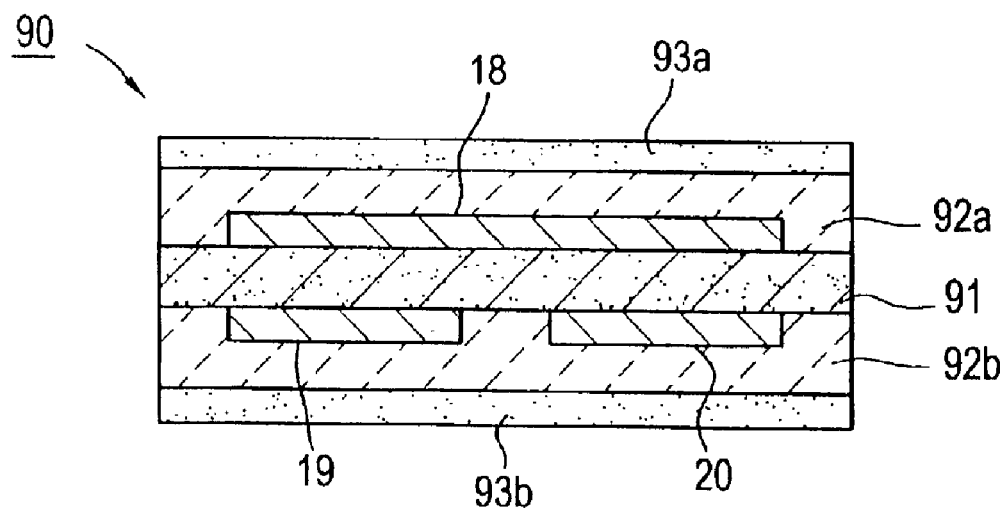
FIG. 7 is a sectional view illustrating a modified example of an outer coating substrate according to various preferred embodiments of the present invention.

For example, in an outer coating substrate 90 shown in FIG. 7, inner electrodes 18 to 20 are stacked interposing the second material layer 91 having a high dielectric constant in order to constitute a three-terminal capacitor. Therefore, a capacitor having a large electrostatic capacity can be constituted. Then, the first material layers 92a and 92b, sintering in the liquid phase, are laminated on the top and bottom of the second material layer 91. On the outside of the first material layers 92a and 92b, the second material layers 93a and 93b having a smaller thickness than the first material layers 92a and 92b are laminated. In this case, centered second material layer 91 is preferably composed of a high dielectric constant material, for example, a barium titanate dielectric ceramic material, to obtain a large electrostatic capacity. That is, the second material layer 91 and the second material layers 93a and 93b may be differentiated in constituent materials as mentioned above.

Figure 8:
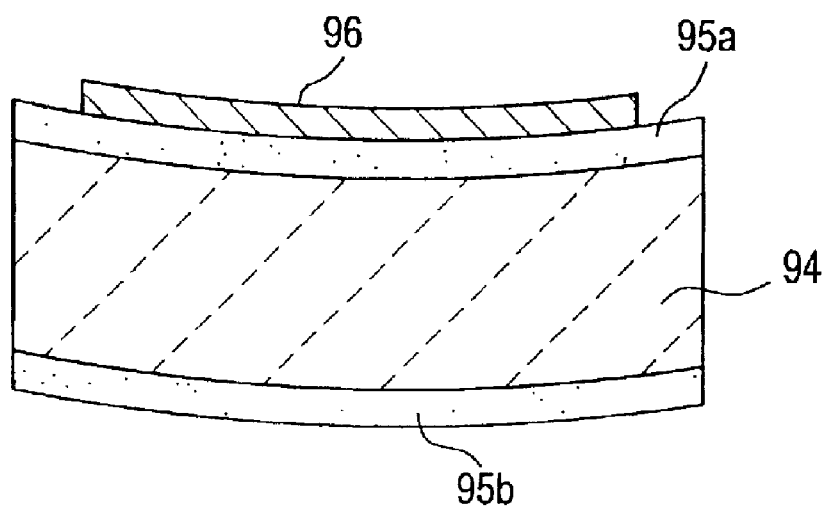
FIG. 8 is a sectional view illustrating a state of an outer coating substrate in which a warp has been generated.
Figure 9:
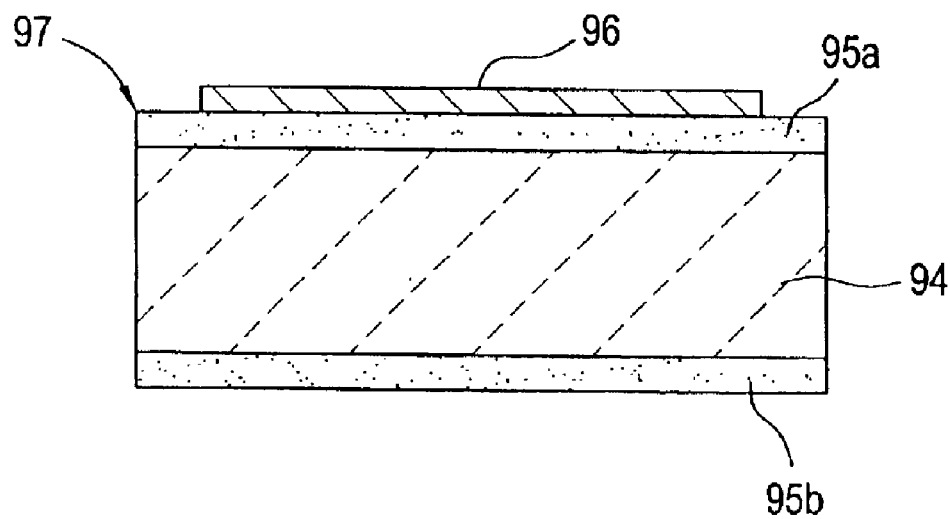
FIG. 9 is a sectional view illustrating another modified example of an outer coating substrate according to various preferred embodiments of the present invention.
Figure 10:
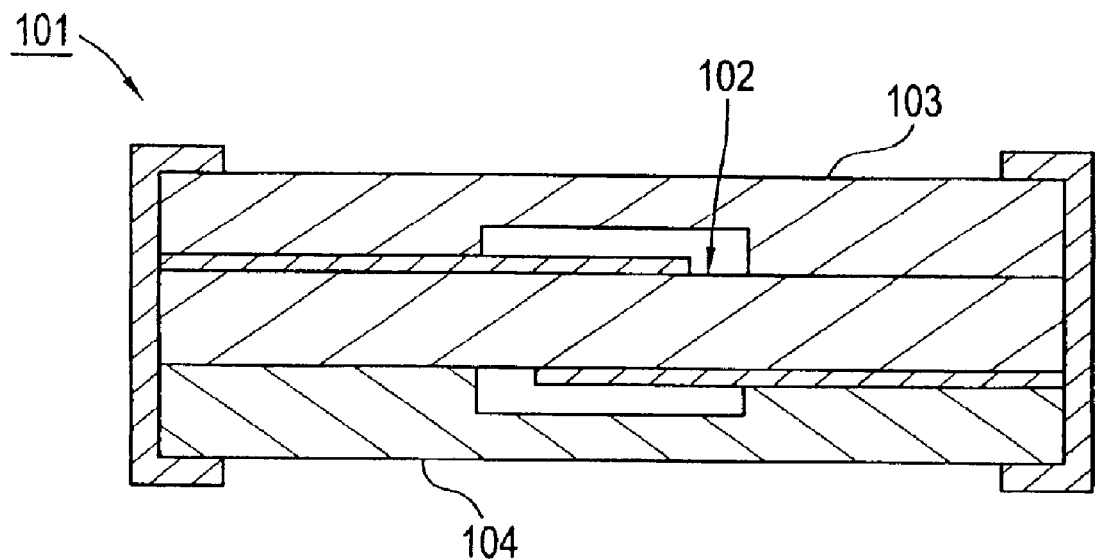
FIG. 10 is a sectional view of an example of conventional piezoelectric resonators.
Figure 11:
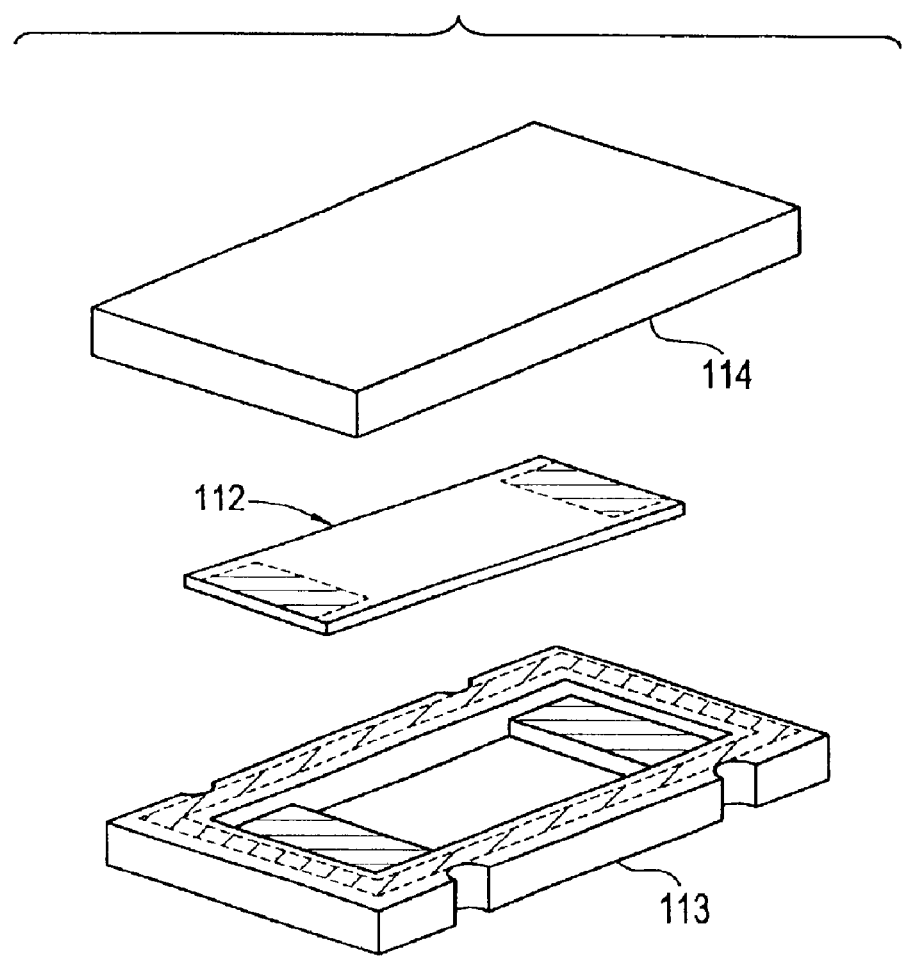
FIG. 11 is a sectional view of another example of conventional piezoelectric resonant components.
Figure 12:
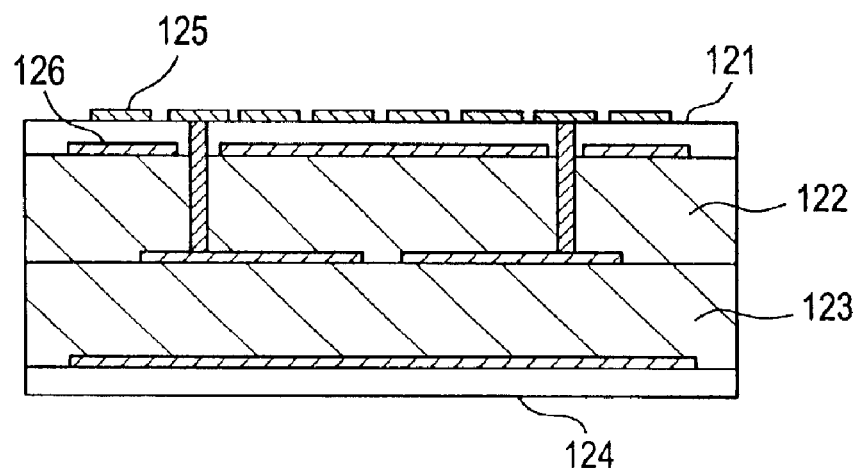
FIG. 12 is a sectional view of another example of conventional electronic components.

In an outer coating substrate shown in FIG. 8, the second material layers 95a and 95b are provided on the top and bottom of the first material layer 94, and an electrode 96 is disposed only on the top thereof. Therefore, during calcination, there is a risk of becoming convex downward due to bending as shown in FIG. 8. In this case, as shown in FIG. 9, the second material layer 95a on the top of the first material layer 94 may be composed of a material having a different thermal expansion coefficient from the second material layer 95b on the bottom of the first material layer 94. That is, by making the thermal expansion coefficient of the second material layer 95a smaller than the thermal expansion coefficient of the second material layer 95b, warping of an outer coating substrate 97 is prevented.

In the first to third preferred embodiments, the capacitor is located in the outer coating substrate. However, a resistive element or an inductance element may be provided by arranging a resistive material or a magnetic material inside, respectively. That is, it is possible to constitute various electronic component functional elements, and it is possible to build in the electronic component functional element having small dispersion electric characteristics in the outer coating substrate.

In the first and second preferred embodiments, the first and second outer coating substrates are laminated on the top and bottom of one piezoelectric resonant element. However, a plurality of piezoelectric resonant elements may be laminated, and the first and second outer coating substrates may be laminated on the top and bottom of the laminate. Inner coating substrates may be interposed between the plurality of piezoelectric resonant elements.

As mentioned above, the outer coating substrates according to preferred embodiments of the present invention are preferably used in piezoelectric resonant components. Furthermore, the outer coating substrates can be widely used for other electronic components than piezoelectric resonant components, then, it is possible to improve the dimensional precision of electronic components, to reduce the cost, and to stabilize electric characteristics when circuits of the capacitor or inductance are constituted in outer coating substrates.

Figure 13A:
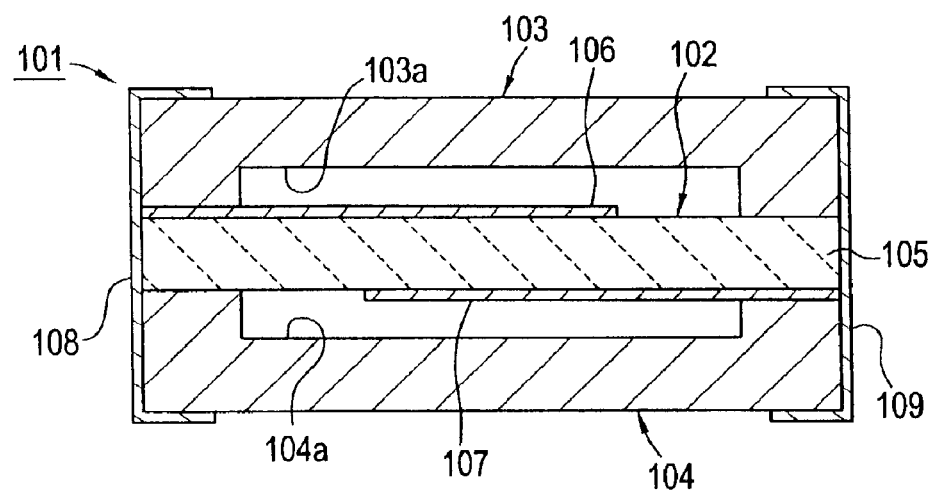
FIGS. 13A and 13B are a sectional view and a perspective external appearance of a piezoelectric resonant component according to the fourth preferred embodiment of the present invention.
Figure 13B:
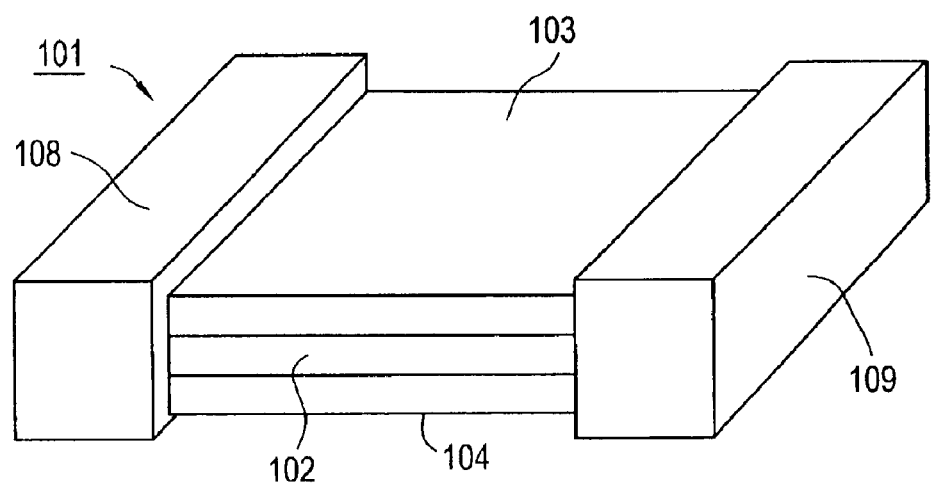

FIGS. 13A and 13B are a sectional view and a perspective external appearance of a piezoelectric resonant component according to the fourth preferred embodiment of the present invention.

In a piezoelectric resonant component 101, the first and second package substrates 103 and 104 are laminated on the top and bottom of a substantially rectangular piezoelectric resonant element 102.

In the piezoelectric resonant component 101, the first and second excitation electrodes 106 and 107 are provided on both the primary surfaces of the piezoelectric substrate 105. The piezoelectric substrate 105 is preferably made of a piezoelectric ceramic material, for example, a lead zirconate titanate ceramic, or a piezoelectric single crystal, for example, a crystal. The Young's moduli of these kinds of piezoelectric materials are normally about $5.0 \times 10^{10}$ to about $18 \times 10^{10}$. In the case in which the triple wave is used, piezoelectric materials having the Young's moduli of about $14.2 \times 10^{10}$ to about $16.2 \times 10^{10}$ are preferably used.

The excitation electrodes 106 and 107 are arranged to face each other on the top and bottom surfaces at the approximate center of the piezoelectric plate 105, and the portion where the excitation electrodes 106 and 107 are arranged to face each other, constitutes an energy trap piezoelectric resonant component. The excitation electrode 106 is led out to one end surface of a structure wherein the piezoelectric resonant element 102, and the package substrate 103 and 104 are laminated, and the excitation electrode 107 is led out to the other end surface. On both end surfaces of the aforementioned laminated structure, outer electrodes 108 and 109 are provided, respectively.

The excitation electrodes 106 and 107 are preferably formed by putting on a conductive material, for example, Ag, or Cu, using the thin film forming method, for example, the vapor deposition, the plating, or the sputtering.

On the other hand, the outer electrodes 108 and 109 are preferably formed by a similar method or by coating and hardening a conductive paste.

The package substrates 103 and 104 have concave portions 103a and 104a in the surface laminated on the piezoelectric resonant element 102. The concave portions 103a and 104a are arranged to define spaces that allow for free and unhindered vibration of the resonant portion of the piezoelectric resonant element 102.

As not shown in FIG. 13, the aforementioned package substrates 103 and 104 are fixed on the piezoelectric resonant element 102 via a junction member preferably made of an insulating adhesive.

The aforementioned package substrates 103 and 104 are preferably made of an insulating material having a lower Young's modulus than a Young's modulus of a piezoelectric material. As the insulating material, insulating ceramics, for example, $Al_2O_3$ and $MgTiO_3$, or a composite of amorphous glass and ceramic powder, or other suitable material., are usable. The Young's moduli of the package substrates 103 and 104 are not particularly limited as far as being lower than the Young's modulus of the piezoelectric material, and package substrates having the Young's moduli of about $9.8 \times 10^{10}$ to about $11.8 \times 10^{10}$ are preferably used.

Therefore, the ratio of the Young's modulus of the package substrate to the Young's modulus of the piezoelectric resonant element 102 is preferably within the range of about 0.60 to about 0.83.

In this preferred embodiment, the spurious vibration generated in the piezoelectric resonant element 102 is propagated to the package substrates 103 and 104 via a junction member (not shown in the drawing). However, because the Young's moduli of the package substrates 103 and 104 are relatively small, the spurious vibration is attenuated. Therefore, it is possible to effectively suppress the spuriousness appearing in resonant characteristics.

The aforementioned spuriousness suppression effect is obtained as long as the Young's moduli of the package substrates 103 and 104 are smaller than the Young's modulus of the piezoelectric material constituting the piezoelectric resonant element 102. Furthermore, when the Young's moduli of the package substrates 103 and 104 are within the aforementioned preferable range, the spuriousness can be more effectively suppressed.

For example, in the case in which a lead zirconate titanate piezoelectric ceramics is used as the piezoelectric material, the Young's modulus is about $15.2 \times 10^{10}$. In the case in which the one made of a composite of $SiO_2$—MgO—$Al_2O_3$ as an amorphous glass and $Al_2O_3$, $BaTiO_3$, or $ZrO_2$ as ceramic powder is used as the package substrates 103 and 104, the Young's modulus is about $10.8 \times 10^{10}$, and in the case in which $Al_2O_3$ 96% in purity is used, the Young's modulus, changing due to the purity, is about $32.0 \times 10^{10}$.

Figure 14:
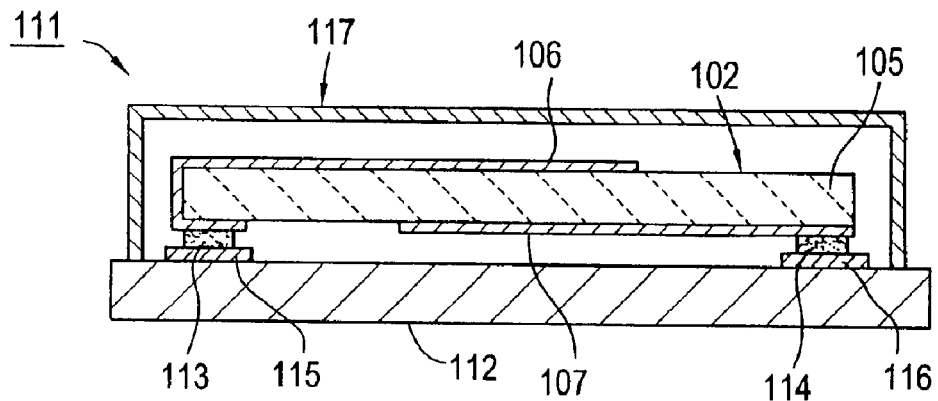
FIG. 14 is a sectional view of a piezoelectric resonant component according to the fifth preferred embodiment of the present invention.

FIG. 14 is a sectional view of a piezoelectric resonant component according to the fifth preferred embodiment of the present invention.

In the piezoelectric resonant component 111 according to the fifth preferred embodiment, an energy trap piezoelectric resonant element 102 is joined on a package substrate 112 on a substrate, via conductive junction members 113 and 114, and is fixed to the package substrate 112. An excitation electrode 106 is arranged on the end surface of a piezoelectric plate 105 and arranged to extend the bottom surface, and a component of the excitation electrode 106 on the bottom surface of the piezoelectric plate 105 is joined on a package substrate 112 with the conductive junction member 113.

On the top surface of the package substrate 112, terminal electrodes 115 and 116 extend to outside thereof are provided. The terminal electrodes 115 and 116 are joined to the aforementioned conductive junction members 113 and 114.

Also, a cap 117 is joined on the package substrate 112. The cap 117 has an opening downward, and is joined on the package substrate 112 via an insulating adhesive (not shown in the drawing), surrounding the piezoelectric resonant element 102.

The cap 117 is preferably made of a material in which at least a surface is conductive, for example, a metal or a structure made by covering a surface of insulating material with a conductive film. By using such a cap 117 having a conductive surface, the piezoelectric resonant element 102 is electromagnetically shielded. However, the cap 117 may be composed of an insulating material or other suitable material.

In this preferred embodiment, also, the Young's modulus of the package substrate 112 is preferably less than the Young's modulus of the piezoelectric material constituting the piezoelectric plate 105 of the piezoelectric resonant element 102. Therefore, similarly to the fourth preferred embodiment, in the case in which the undesired spurious vibration generated in the piezoelectric resonant element 102 is propagated to the package substrate 112 via conductive junction members 113 and 114, the vibration is attenuated by the package substrate 112. Therefore, the undesired spuriousness in resonant characteristics is effectively suppressed.

Figure 15:
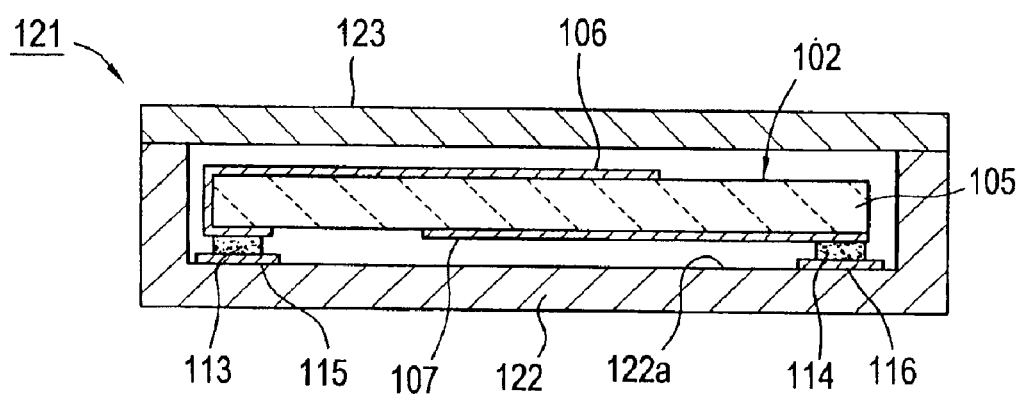
FIG. 15 is a sectional view of a piezoelectric resonant component according to the sixth preferred embodiment of the present invention.

FIG. 15 is a sectional view of a piezoelectric resonant component according to the sixth preferred embodiment of the present invention. In the piezoelectric resonant component 121 according to this preferred embodiment, a package substrate 122 has a concave portion 122a, and a piezoelectric resonant element 102 is stored in the concave portion 122a. That is, the package substrate 122 has an opening opened upward, and the inside of the opening constitutes the concave portion 122a. In the concave portion 122a, similarly to the fifth preferred embodiment, the piezoelectric resonant element 102 is fixed to the package substrate 122 via conductive junction members 113 and 114. A covering member 123 is joined on the end surface of opening of the package substrate 122 via an adhesive, not shown in the drawing, in order to close the concave portion 122a.

This preferred embodiment is constituted similarly to the fifth preferred embodiment, except that the package substrate 122 having the concave portion 122a is used instead of the package substrate 112, and the covering member 123 is used instead of the cap 117. That is, the Young's modulus of the package substrate 122 is smaller than the Young's modulus of the piezoelectric material constituting the piezoelectric plate 105 of the piezoelectric resonant element 102. Therefore, similarly to the fifth preferred embodiment, the undesired spuriousness generated in the piezoelectric resonant element 102 is attenuated in the package substrate 122, and the spuriousness appearing in resonant characteristics is effectively suppressed.

In the aforementioned fourth to sixth preferred embodiments, by selecting a piezoelectric resonant element and a Young's modulus of package substrate, the undesired spuriousness is effectively suppressed as mentioned above. Therefore, the piezoelectric resonant components according to the fourth to sixth preferred embodiments are easily manufactured, and the undesired spuriousness is suppressed without increasing the cost of piezoelectric resonant component.

Figure 16:
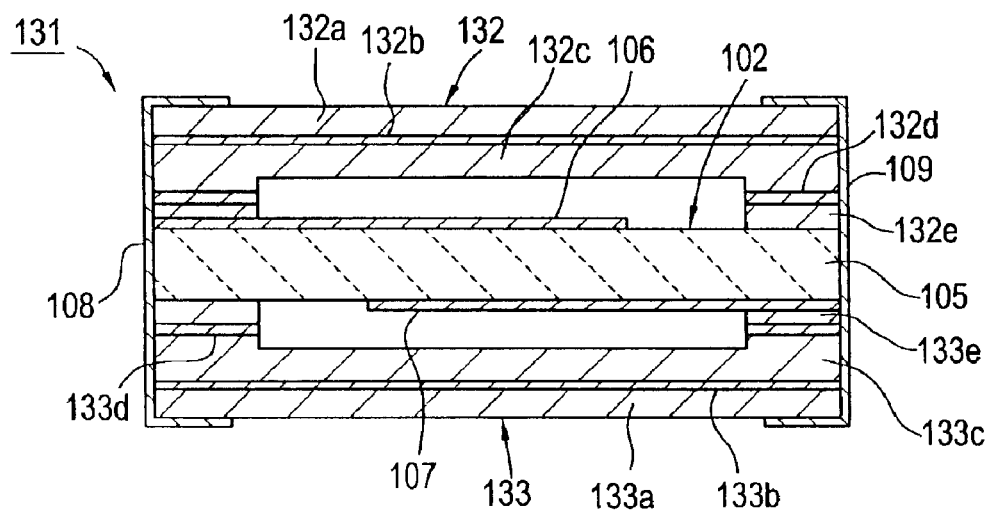
FIG. 16 is a sectional view of a piezoelectric resonant component according to the seventh preferred embodiment of the present invention.

FIG. 16 is a sectional view of a piezoelectric resonant component according to the seventh preferred embodiment of the present invention.

In the piezoelectric resonant component 131 according to the seventh preferred embodiment, the first and second package substrates 132 and 133 are laminated on the top and bottom of the piezoelectric resonant element 102. The seventh preferred embodiment is different from the fourth preferred embodiment in that the first and second package substrates 132 and 133 preferably include multi-layered package substrates in which a plurality of material layers are laminated. Regarding other points, because of the similarity to the fourth preferred embodiment, detailed explanations of the same elements of the fourth preferred embodiment are omitted except for using the same reference numerals for similar elements.

The package substrate 132 has a structure in which the first to fifth material layers 132a to 132e are laminated together. Among these, the first, third, and fifth material layers 132a, 132c, and 132e are preferably made of $SiO_2$—MgO—$Al_2O_3$, and the second and fourth material layers 132b and 132d are preferably made of $Al_2O_3$. Therefore, the Young's modulus of $SiO_2$—MgO—$Al_2O_3$ constituting the first, third, and fifth material layers 132a, 132c, and 132e is about $8.01 \times 10^{10}$, and the Young's modulus of $Al_2O_3$ constituting the second and fourth material layers 132b and 132d is about $32.0 \times 10^{10}$. By controlling the thickness of the first, third, and fifth material layers 132a, 132c, and 132e and the thickness of the second and fourth material layers 132b and 132d, in this preferred embodiment, the Young's modulus of the first package substrate 132 as a whole is about $10.8 \times 10^{10}$. Similarly, the package substrate 133 also has a structure laminating the first to fifth material layers 132a to 132e, and the Young's modulus as a whole is about $10.8 \times 10^{10}$.

On the other hand, the piezoelectric plate 105 of the piezoelectric resonant element 102 includes a lead zirconate titanate ceramics, and its Young's modulus is about $15.2 \times 10^{10}$.

That is, the ratio of the Young's modulus of the package substrate 132 and 133 to the Young's modulus of the piezoelectric material is about 0.71. Therefore, similarly to the preferable example of the fourth preferred embodiment, in the case in which the spurious vibration generated in the piezoelectric resonant element 102 is propagated to the package substrates 132 and 133 via junction members not shown in the drawing, the spurious vibration is attenuated by the package substrates 132 and 133, and the undesired spuriousness appearing in resonant characteristics can be effectively suppressed.

The aforementioned package substrates 132 and 133 can be easily obtained by laminating and calcining a green sheet, primarily composed of a material made of amorphous glass and ceramic powder, and a green sheet made of $Al_2O_3$. That is, these can be easily obtained using the manufacturing method for ceramics multi-layered substrates. Therefore, the cost of the piezoelectric resonant component 131 is not increased.

Figure 17:
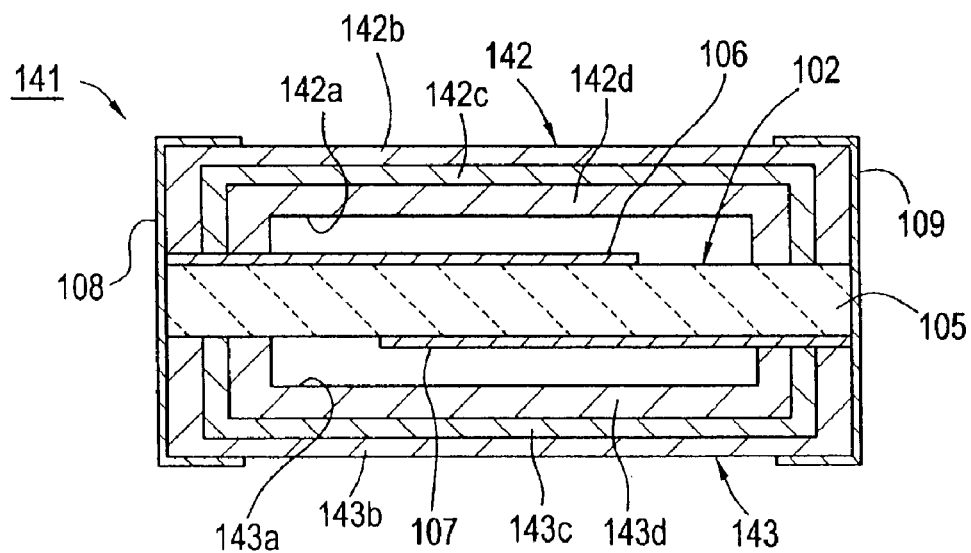
FIG. 17 is a sectional view of a piezoelectric resonant component according to the eighth preferred embodiment of the present invention.

FIG. 17 is a sectional view of a piezoelectric resonant component according to the eighth preferred embodiment of the present invention. In the piezoelectric resonant component 141, the first and second package substrates 142 and 143 are laminated on both primary surfaces of the piezoelectric resonant element 102. The eighth preferred embodiment is constituted similarly to the seventh preferred embodiment except that the structures of package substrates 142 and 143 are different from the seventh preferred embodiment.

That is, the first and second package substrates 142 and 143 are multi-layered package substrates. However, the multi-layered structures are differentiated from the package substrates 132 and 133 shown in FIG. 16.

The first package substrate 142 is taken as an example. The first package substrate 142 has a concave portion 142a for allowing for free and unhindered vibration of the resonant portion of the piezoelectric resonant element 102. The package substrate 142 has the first to third material layers 142b to 142d. The material layers 142b to 142d are each arranged to surround the aforementioned concave portion 142a. In other words, in the sectional view shown in FIG. 17, the first to third material layers 142b to 142d are each shaped like a symbol "]," wherein the end potion is constituted to reach the component joined to the piezoelectric resonant element 102. This is similar in the package substrate 143. Thus, when the package substrates 142 and 143 are multi-layered structures, each material layer can be constituted in various forms.

In the eighth preferred embodiment, because the Young's modulus of the first and second package substrates 142 and 143 as a whole is less than the Young's modulus of the piezoelectric material constituting the piezoelectric resonant element 102, similarly to the fourth to seventh preferred embodiment, the spurious vibration is attenuated in the package substrates 142 and 143, and, as a result, the undesired spuriousness appearing in resonant characteristics is effectively suppressed.

Figure 18:
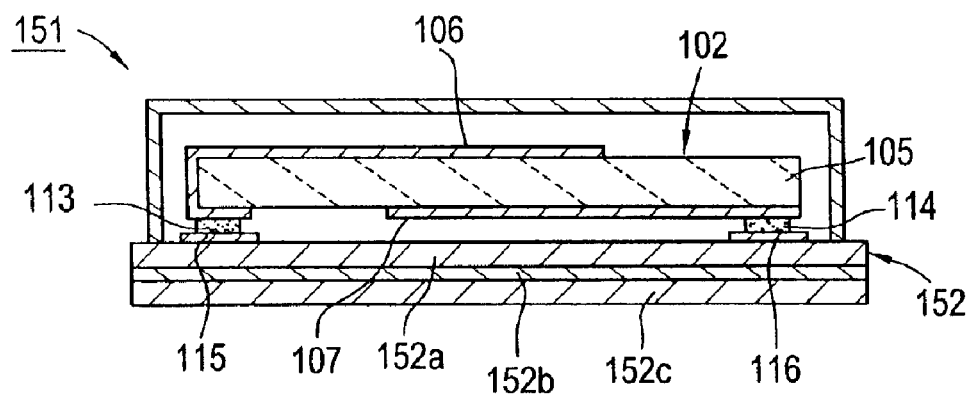
FIG. 18 is a sectional view of a piezoelectric resonant component according to the ninth preferred embodiment of the present invention.

FIG. 18 is a sectional view of a piezoelectric resonant component according to the ninth preferred embodiment of the present invention.

The piezoelectric resonant component 151 corresponds to a modification of the fifth preferred embodiment, and is different only in that a multi-layered package substrate 152 is used instead of the package substrate 112 used in the fifth preferred embodiment.

The package substrate 152 has a structure in which the first to third material layers 152a to 152c is laminated. The first and third material layers 152a and 152c are preferably made of $SiO_2$—MgO—$Al_2O_3$, and the second material layer 152b is preferably made of $Al_2O_3$. By controlling the thickness of the material layers, in this preferred embodiment, the Young's modulus of the package substrate 152 as a whole is about $10.8 \times 10^{10}$. Then, the ratio of the Young's modulus of the package substrate 152 to the Young's modulus of the piezoelectric material is about 0.71.

Therefore, similarly to the fourth to eighth preferred embodiments, the spurious vibration generated in the piezoelectric resonant element 102 can be attenuated in the package substrate 152, and, as a result, the spuriousness appearing in resonant characteristics can be effectively suppressed.

Figure 19:
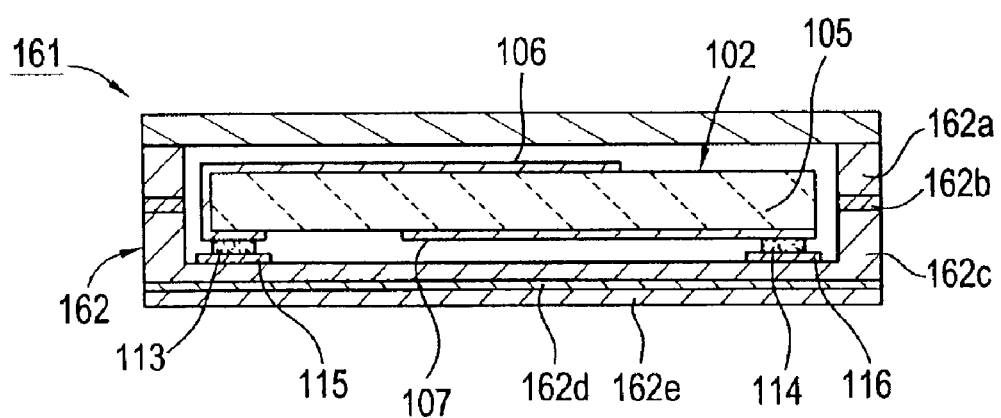
FIG. 19 is a sectional view of a piezoelectric resonant component according to the tenth preferred embodiment of the present invention.

FIG. 19 is a sectional view of a piezoelectric resonant component according to the tenth preferred embodiment of the present invention. The piezoelectric resonant component 161 corresponds to a modification of the sixth preferred embodiment, and is different in only that a multi-layered package substrate 162 is used instead of the package substrate 122.

The multi-layered package substrate 162 has a structure in which the first to fifth material layers 162a to 162e laminated. The first, third, and fifth material layers 162a, 162c, and 162e are preferably made of $SiO_2$—MgO—$Al_2O_3$, and the second and fourth material layers 162b and 162d are preferably made of $Al_2O_3$. By controlling the thickness of the first to fifth material layers 162a to 162e, the Young's modulus of the package substrate 162 as a whole is about $10.8 \times 10^{10}$.

Therefore, the ratio of the Young's modulus of the package substrate to the Young's modulus of the piezoelectric material is about 0.71 and, similarly to the fourth to ninth preferred embodiments, the spurious vibration generated in the piezoelectric resonant element 102 is attenuated in the package substrate 162. Then, the undesired spuriousness appearing in resonant characteristics can be effectively suppressed.

In the aforementioned fourth to ninth preferred embodiments, the case, in which the energy trap piezoelectric resonant element 102 is used, is taken as an example and is explained. However, in preferred embodiments of the present invention, a piezoelectric filter element, wherein a plurality of energy trap resonant portions are constituted, may be used as the aforementioned piezoelectric resonant element.

Furthermore, electrodes may be formed as a component of a piezoelectric resonant element, and besides a piezoelectric resonant portion, other electronic component function portion, for example, a capacitor portion, may be constituted.

In the outer coating substrate for an electronic component according to preferred embodiments of the present invention, because the first material layer that is sintered in the liquid phase and the second material layer that is not sintered at the sintering temperature of the first material layer are laminated, and are calcined at a temperature at which the first material layer is sintered, the low temperature calcination is possible. Therefore, the cost of the outer coating substrate is greatly reduced.

Because the first material layer that is sintered in the liquid phase is superior in mechanical strength, and has a flexural strength of about 200 kg/cm² to about 2500 kg/cm², an outer coating substrate having a higher flexural strength than conventional dielectric ceramics having a flexural strength of about 800 kg/cm² to about 1500 kg/cm², and having superior mechanical strength can be constituted.

Furthermore, the second material layer is laminated on the first material layer, and because the second material layer functions as a restriction material layer during the calcination of the first material layer, the contraction of the first material layer during the calcination is restricted, then the substrate precision is extremely improved. Therefore, the outer coating substrate having superior dimensional precision is provided, and the thinning and miniaturization of the outer coating substrate and, furthermore, the electronic component using the outer coating substrate are achieved.

In the case in which the first material layer is composed of glass or glass-ceramics, it is possible to be calcined at a relatively low temperature of about 800° C. to about 1000° C., and it is possible to effectively reduce the cost of the outer coating substrate.

In the case in which the outer coating substrate does not contain a component that is dissolved into a wet plating bath, because the plating resistance of the outer coating substrate is improved, for example, by forming an outer electrode on the outer surface of the outer coating substrate and, furthermore, forming a plated film, the reliability of the outer coating substrate and, furthermore, the electronic component is greatly increased.

In the case in which a concave portion is provided on at least one primary surface of an outer coating substrate, by using the concave portion, it is possible to store an electronic component element, for example, a piezoelectric resonant element, or to form a space that allows for free and unhindered vibration of resonant portion of an energy trap piezoelectric resonant element.

In the case in which at least one pair of capacitive electrodes, interposing at least a component of the first or second material layer, is provided, and a capacitor is defined by the pair of capacitive electrodes, because the dimensional precision of an outer coating substrate is improved, the precision of an electrostatic capacity of the condenser is also improved. In particular, in the case in which one pair of capacitive electrodes, arranged to face each other and interpose at least a component of the second material layer, is provided, ceramics having a high dielectric constant can be used as the second material layer, then, it is possible to achieve a large electrostatic capacity.

In the case in which a resistive element and an inductance element in an outer coating substrate are composed of a resistive material and a magnetic material, by improving the dimensional precision of the substrate, the resistive element and the inductance element having superior precision of the resistance and inductance can be constituted.

In the case in which at least two first material layers are laminated, the mechanical strength of outer coating substrates is effectively improved because of the plurality of first material layers, and the thinning of the outer coating substrate is achieved.

In the piezoelectric resonant component according to preferred embodiments of the present invention, because at least one of the first and second outer coating substrates includes the outer coating substrate for electronic components according to preferred embodiments of the present invention, the mechanical strength and the dimensional precision of the outer coating substrate are greatly improved. Therefore, the dimensional precision and the mechanical strength of the entire piezoelectric resonant component are improved, and because the outer coating substrate can be calcined at a low temperature, the cost of piezoelectric resonant component is reduced.

Furthermore, due to the improvement of the dimensional precision of the outer coating substrate, the dispersion of the characteristics of piezoelectric resonant component is also reduced.

In the case in which a piezoelectric resonant element is an energy trap piezoelectric resonant element, and the first and second outer coating substrates are laminated on the piezoelectric resonant element so as to define a space for allowing for free and unhindered vibration of the resonant portion of the energy trap piezoelectric resonant element, according to preferred embodiments of the present invention, the energy trap piezoelectric resonant component having superior dimensional precision, having a high mechanical strength, and capable of being inexpensively prepared, can be provided.

In the case in which a concave portion is disposed on a surface and laminated on a piezoelectric resonant element, of at least one of the first and second outer coating substrates, a space for allowing for free and unhindered vibration is defined by the concave portion.

In the piezoelectric resonant component according to preferred embodiments of the present invention, in the case in which the first material layer is composed of glass or glass-ceramics, it is possible to calcine at a relatively low temperature of about 800° C. to about 1000° C., and the cost of outer coating substrate can be effectively reduced.

In the piezoelectric resonant component according to preferred embodiments of the present invention, in the case in which the first and second outer coating substrates do not contain a component that dissolves into a wet plating bath, because the plating resistance of the outer coating substrate is improved, for example, by forming an outer electrode on the outer surface of the outer coating substrate and, furthermore, forming a plated film, the reliability of the outer coating substrate and, furthermore, the electronic component are greatly increased.

In the case in which, in at least one of the first and second outer coating substrates of the piezoelectric resonant component of preferred embodiments of the present invention, furthermore, at least one pair of capacitive electrodes arranged to interpose at least a component of the first material layer is provided, a capacitor is defined by the pair of capacitive electrodes. Then, the dispersion of electrostatic capacity of the capacitor is reduced due to the improvement of the dimensional precision of the outer coating substrate. Therefore, a built-in capacitor type piezoelectric resonant component having a small dispersion of electrostatic capacity of the capacitor is provided.

In the piezoelectric resonant component according to preferred embodiments of the present invention, in the case in which a resistive element and an inductance element in an outer coating substrate are composed of a resistive material and a magnetic material, by improving the dimensional precision of the substrate, the resistive element and the inductance element having superior precision of the resistance and inductance can be constituted.

In the case in which at least one of the first and second outer coating substrates of the piezoelectric resonant component of preferred embodiments of the present invention has a plurality of first material layers, the mechanical strength of the outer coating substrate is effectively improved because of the plurality of first material layers, and the thinning of the outer coating substrate is achieved.

In the piezoelectric resonant component according to preferred embodiments of the present invention, because the Young's modulus of the package substrate is less than the Young's modulus of the piezoelectric material constituting the piezoelectric resonant element, in the case in which the spurious vibration generated in the piezoelectric resonant element is propagated to the package substrate via junction members, the spurious vibration is attenuated in the package substrate. Therefore, the undesired spuriousness appearing in resonant characteristics and filter characteristics can be effectively suppressed.

In the present invention, as mentioned above, because the undesired spuriousness can be effectively suppressed by controlling the Young's modulus of the piezoelectric material constituting the package substrate and the piezoelectric resonant element, the manufacturing process is greatly simplified, and the increase in cost of the piezoelectric resonant component is prevented.

Therefore, it becomes possible to easily and inexpensively provide a piezoelectric resonant component generating no undesired spuriousness, and having superior characteristics.

In the case in which the aforementioned package substrate includes a multi-layered package substrate having at least two layers, by controlling the number of layers, thickness, and other characteristics of the materials constituting each layer, the package substrate having a smaller Young's modulus compared to piezoelectric materials, and being able to effectively suppress the undesired spuriousness can be easily constituted.

In the case in which a multi-layered package substrate has a layer, having a larger Young's modulus than a Young's modulus of piezoelectric material, and a layer, having a smaller Young's modulus than the piezoelectric material, as far as the Young's modulus as a whole is specified at the smaller value than the Young's modulus of the piezoelectric material, the multi-layered package substrate can be composed of various materials. For example, by laminating layers made of materials having a large Young's modulus but having superior heat resistance and dimension stability, the dimension stability, the heat resistance, and other characteristics, of the piezoelectric resonant component are greatly improved.

Such a structure can be attained when, for example, the layer having a small Young's modulus is made of a composite of amorphous glass and ceramic powder, and the layer having a large Young's modulus uses $Al_2O_3$ or $MgTiO_3$.

In the case in which the piezoelectric resonant element is an energy trap piezoelectric resonant element having an energy trap resonant portion, according to preferred embodiments of the present invention, an energy trap piezoelectric resonant component generating minimal undesired spuriousness, and being inexpensive can be provided.

In the case in which package substrates are laminated on both surfaces of a piezoelectric resonant element, the undesired spuriousness can be effectively suppressed on the both surfaces of the piezoelectric resonant element.

In the case in which a piezoelectric resonant element is fixed on a package substrate, and a cap member is joined to the package substrate surrounding the piezoelectric resonant element, the undesired spuriousness can be suppressed by the package substrate, and the piezoelectric resonant element can be surely sealed in the package structure, composed of the package substrate and the cap, by the cap member.

Similarly, in the case in which a package substrate has a concave portion to store a piezoelectric resonant element, and a cover member is fixed to the package member, the undesired spuriousness can be suppressed by the package substrate, and the piezoelectric resonant element can be surely sealed in the package structure, composed of the package substrate and the covering member.

While the invention has been described with reference to preferred embodiments thereof, many modifications and variations of the present invention are possible in light of the above teachings. It is therefore to be understood that within the scope of the appended claims, the invention may be practiced otherwise than as specifically described.

What is claimed is:

1. An outer coating substrate for an electronic component, comprising:

a multi-layered substrate having a first material layer and a second material layer laminated together; wherein the first material layer is capable of being sintered in a liquid phase and the second material layer is not capable of being sintered at the sintering temperature of the first material layer; and said substrate does not contain a component that is capable of dissolving into a wet plating bath.

2. An outer coating substrate for an electronic component according to claim 1, wherein said first material layer is made of one of glass and glass-ceramics.

3. An outer coating substrate for an electronic component according to claim 1, wherein a concave portion is provided on at least one primary surface of said substrate.

4. An outer coating substrate for an electronic component according to claim 1, wherein said substrate has at least one pair of capacitive electrodes arranged to face each other and interposing at least a portion of said second material layer, and a capacitor is defined by said pair of capacitive electrodes.

5. An outer coating substrate for an electronic component according to claim 1, wherein a resistive element and an inductance element are provided in said substrate and are composed of a resistive material and a magnetic material.

6. An outer coating substrate for an electronic component according to claim 1, wherein at least two layers of said first material layer are laminated together with said second material layer.

* * * * *